US009231567B2

(12) United States Patent
Sul et al.

(10) Patent No.: US 9,231,567 B2
(45) Date of Patent: Jan. 5, 2016

(54) TEST SOLUTION FOR A RANDOM NUMBER GENERATOR

(71) Applicant: Silicon Image, Inc., Sunnyvale, CA (US)

(72) Inventors: Chinsong Sul, Santa Clara, CA (US); Hyukyong Kwon, Dublin, CA (US); Andy Ng, Hayward, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 14/193,932

(22) Filed: Feb. 28, 2014

(65) Prior Publication Data

US 2014/0191813 A1   Jul. 10, 2014

Related U.S. Application Data

(63) Continuation-in-part of application No. 13/605,708, filed on Sep. 6, 2012, now Pat. No. 8,841,974.

(60) Provisional application No. 61/820,603, filed on May 7, 2013.

(51) Int. Cl.
*H03B 29/00* (2006.01)
*H03K 3/03* (2006.01)
*G06F 7/58* (2006.01)

(52) U.S. Cl.
CPC ............... *H03K 3/0315* (2013.01); *G06F 7/58* (2013.01); *G06F 7/588* (2013.01)

(58) Field of Classification Search
CPC ............ H03K 3/0315; H03K 2005/00065; H03K 5/133; H03K 5/159; H03K 19/0963; H03K 19/215; H03K 2005/00052; H03K 2005/00234; H03K 23/005; H03K 23/40; H03K 5/1252; H03K 5/13; H03K 5/132; H03K 5/151; H03L 7/0814; G06F 7/58
USPC ............ 331/78; 708/251, 250; 324/765, 527; 714/726, 728; 716/113; 702/69
See application file for complete search history.

(56) References Cited

U.S. PATENT DOCUMENTS 5,341,096 A * 8/1994 Yamamura ................. 324/750.3
6,798,230 B1   9/2004 Taylor et al.
7,279,996 B2 * 10/2007 Boerstler et al. ............... 331/57

(Continued)

FOREIGN PATENT DOCUMENTS

| CN | 101373203 A | 2/2009 |
| CN | 101819515 A | 9/2010 |
| JP | 2009-117894 A | 5/2009 |
| JP | 2009-163539 A | 7/2009 |

OTHER PUBLICATIONS

PCT International Search Report and Written Opinion, PCT Application No. PCT/US2013/055176, Dec. 17, 2013, 12 pages.

(Continued)

*Primary Examiner* — Arnold Kinkead
(74) *Attorney, Agent, or Firm* — Fenwick & West LLP

(57) ABSTRACT

A random number generator and method for testing the same are described. In one embodiment, the random number generator comprises one or more ring oscillator structures, each of the one or more ring oscillator structures having a ring oscillator for use in generating random numbers and having a test structure to reconfigure the ring oscillator into a testable structure.

18 Claims, 14 Drawing Sheets

(56) References Cited

U.S. PATENT DOCUMENTS

| | | |
|---|---|---|
| 7,532,078 B2 * | 5/2009 | Agarwal et al. .................. 331/57 |
| 2008/0048790 A1 | 2/2008 | Bang et al. |
| 2011/0090015 A1 | 4/2011 | Sumita et al. |
| 2011/0163818 A1 | 7/2011 | Dichtl et al. |
| 2011/0219277 A1 | 9/2011 | Jen et al. |

OTHER PUBLICATIONS

United States Office Action, U.S. Appl. No. 13/605,708, Dec. 3, 2013, 6 pages.

Chinese First Office Action, Chinese Application No. 201380046554.9, Sep. 22, 2015, 11 pages.

* cited by examiner

TEST SOLUTION FOR A RANDOM NUMBER GENERATOR

This is a continuation-in-part application of co-pending U.S. patent application Ser. No. 13/605,708, entitled, "Test Solution for Ring Oscillators", filed Sep. 6, 2012, which is incorporated by reference herein in its entirety. This is also a non-provisional application of provisional U.S. Patent Application No. 61/820,603, filed May 7, 2013, which is incorporated by reference herein in its entirety.

FIELD OF THE INVENTION

Embodiments of the present invention relate to the field of random number generators; more particularly, embodiments of the present invention relate to testing of a random number generator for secret key generation in high-definition content protection (HDCP).

BACKGROUND OF THE INVENTION

Randomness is found a critical role in cryptography for ensuring security of data transmission. In order to implement randomness in hardware, metastability of flip-flop or a clock jitter is used as a source of randomness. Many of the implementations employ ring oscillators as a clock. A large number of ring oscillators are often employed to maintain a required level of randomness. There are 256 ring oscillators used in the HDCP 2.x for a secret key generation for a safe data transmission.

FIG. 1A illustrates a simplified view of data encryption and decryption in HDCP. Referring to FIG. 1A, a secret key is constructed from a random number generated from True Random Number Generator (TRNG). The random number is used to calculate the secret keys both at the source and the sink. The random number is generated first from the source and the secret key is computed. At the same time, the random number can be transmitted to the sink so that it can calculate its own secret key. The source encrypts the video stream using the secret key via the XOR operation and encrypted video stream is transmitted to the sink. The sink uses its own secret key to decrypt the received encrypted video stream.

TRNG 102 employs a large number of ring oscillators to generate the random number. FIG. 1B illustrates an example of a TRNG. Referring to FIG. 1B, ring oscillators (ROs) $201_{1-N}$ are the odd number of inverters 210 connected back-to-back through the combinational feedback as shown. The outputs of ring oscillators $201_{1-N}$ are combined using XOR logic 202 and the output of XOR logic is connected to flip-flop 203. The sampling clock $F_s$ is provided to capture a stream of the output of XOR logic 202 in order to obtain the random numbers.

Due to an inherent combinational feedback in ring oscillators $201_{1-N}$, testing of each of ring oscillators $201_{1-N}$ using the economical structural tests such as the stuck-at test can be difficult. Often, ring oscillators $201_{1-N}$ are functionally tested one at a time in isolation. Such conventional ring oscillator tests can involve observation of the ring oscillator output directly at the tester or employment of some on-chip counters to detect the oscillation produced by the ring oscillator under test. Testing the output of ring oscillator at the tester may be costly due to asynchronous nature of ring oscillator and inefficient test access. The test method employing the on-chip counters may suffer from hardware and test time overhead due to a test setup of each individual ring oscillator.

Thus, cost of the functional test can be substantial if a number of ring oscillators is large and is increasing. It is critical to provide low cost test solutions that are not cost sensitive to the increase in problem size, i.e. the number of employed ring oscillators, especially when the price of commercial ICs is continuously under the pressure but their cost of test persists if not increasing.

SUMMARY OF THE INVENTION

A random number generator and method for testing the same are described. In one embodiment, the random number generator comprises one or more ring oscillator structures, each of the one or more ring oscillator structures having a ring oscillator for use in generating random numbers and having a test structure to reconfigure the ring oscillator into a testable structure.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1A:
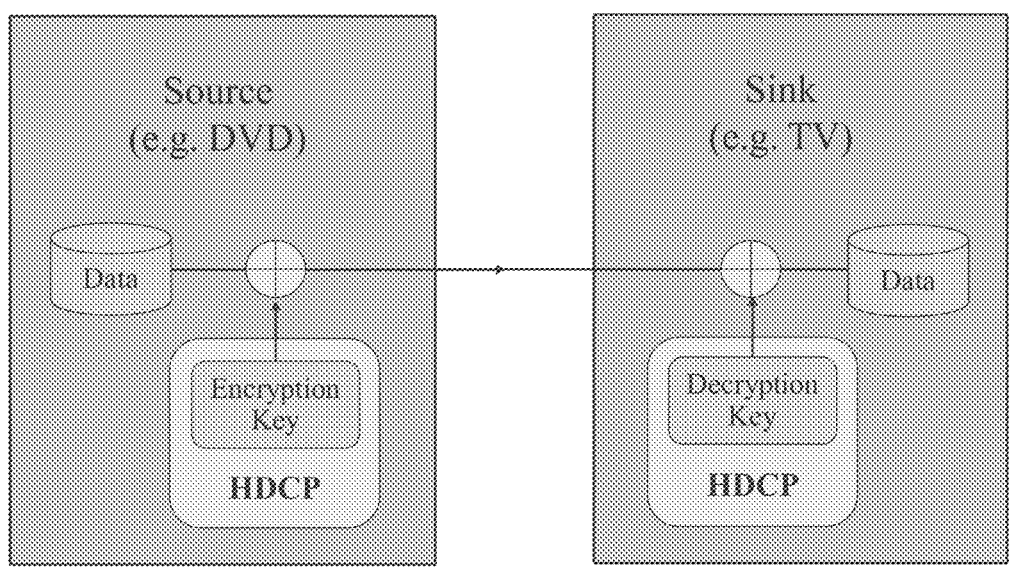
FIG. 1A illustrates secured data transmission using HDCP.
Figure 1B:
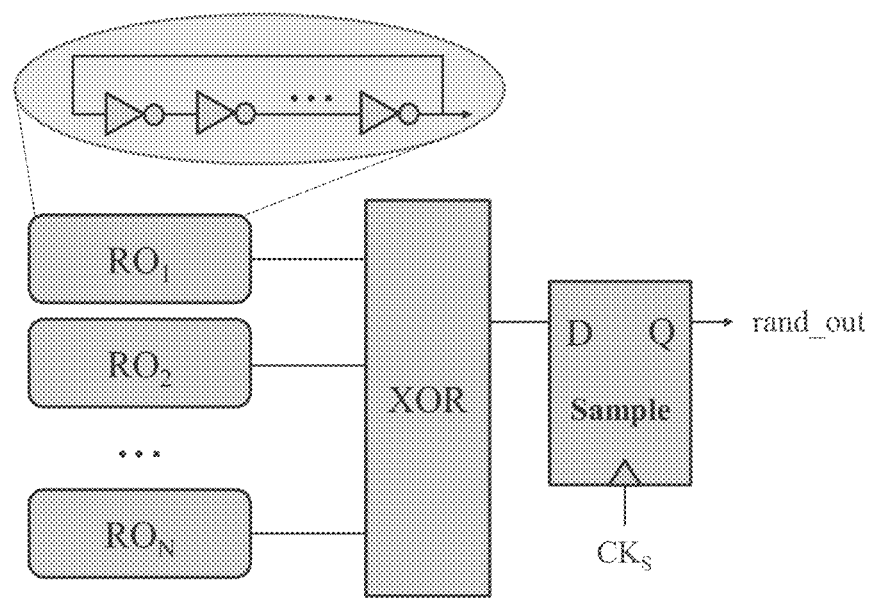
FIG. 1B illustrates an example of a true random number generator (TRNG).

A scheme that allows for both a structural test and a functional test to be applied to the testing of a True Random Number Generator (TRNG) involving a large number of ring oscillators is described. In one embodiment, the scheme achieves this goal by transforming the existing ring oscillators into a testable form referred to herein as a "ring oscillator test structure" that provides proper test access for testing the TRNG. The ring oscillator test structure can reconfigure the ring oscillators into a testable structure that allows the structural stuck-at test, and a parallel functional test of ring oscillators. The described scheme can reduce the test time increase to an insignificant level for the greater number of ring oscillators.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

In one embodiment, the ring oscillator architecture has at least one ring oscillator structure, and each ring oscillator structure has a ring oscillator and a test structure. The ring oscillator has an inverter chain with an odd number of inverters connected back-to-back and operable to produce an oscillatory output. The test structure is coupled to the ring oscillator and provides either an observability chain input or a test input to the ring oscillator and receives the oscillatory output as a feedback from the ring oscillator. In one embodiment, the test structure is operable to reconfigure the ring oscillator into a testable structure to allow one or more of a structural stuck-at test and a functional test of the ring oscillator to validate whether the ring oscillator can produce an intended oscillating frequency within a specified jitter limit. In one embodiment, the ring oscillator architecture also includes an AND gate having a pair of inputs and an output, and the output is coupled to the input of the ring oscillator.

In one embodiment, the test structure is responsive to a plurality of control signals. In one embodiment, one of the control signals includes a test control signal from a register internal to the ring oscillator architecture. In one embodiment, one of the control signals includes is a ring oscillator test mode signal that indicates whether the ring oscillator under test is in functional mode or test mode.

In one embodiment, each ring oscillator structure comprises a group of ring oscillator structures connected in a serial chain, wherein a test output of a last of the ring oscillator test structures in the serial chain is fed back for use with the test input to a first ring oscillator structure in the chain. In one embodiment, the serial chain contains an odd number of inverters. In one embodiment, each ring oscillator structure further comprises a gate to conditionally activate a feedback path to feed back the test output based on a feedback enable signal. In one embodiment, each ring oscillator structure further comprises an XOR gate to XOR the test output fed back from the last of the test structures with the test input. In one embodiment, one or more ring oscillators (less than all) is selected for testing by asserting an enable signal of each of the ring oscillators being tested.

A Proposed TRNG Test Environment

Figure 2:
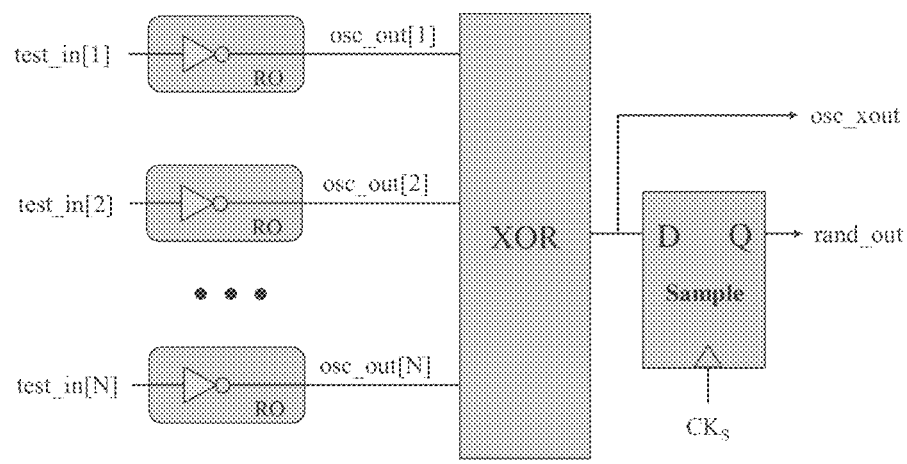
FIG. 2 illustrates an example of a target test environment of a TRNG.

FIG. 2 illustrates one embodiment of a TRNG test scheme. Referring to FIG. 2, the scheme transforms each ring oscillator into an input test access port which can test oscillation of the ring oscillator (RO) while providing the test input to the XOR network. The test access port, referred to herein as test_in[k], can be viewed as an inverter with an external input. The test result can be observed at the Sample flip-flop (FF) and the output of XOR network, or the osc_xout.

In one embodiment, the test patterns for the TRNG are computed and provided through the test_in[k] for all k, and every input change to the test_in[k] can trigger testing of the RO[k] for oscillation. Hence, the same test patterns that test the TRNG logic can also test the ROs.

Figure 3:
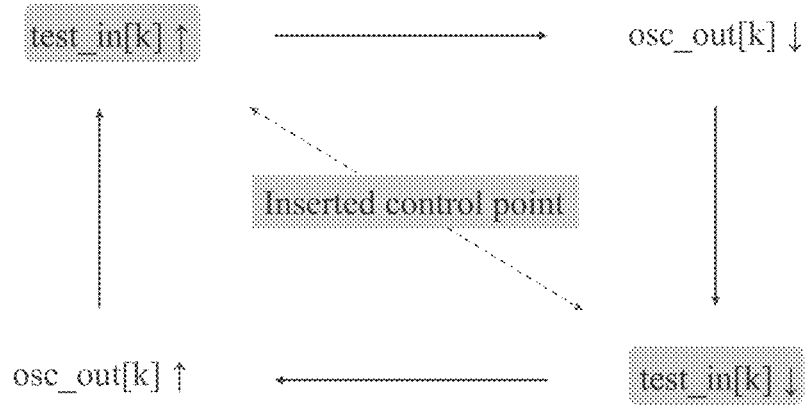
FIG. 3 illustrates the intended behavior of test access port.

FIG. 3 illustrates the target behavior of RO under control of a test access port. Referring to FIG. 3, the upward and the downward arrows denote low-to-high and high-to-low signal transitions, respectively. If the test access port were enabled, oscillation of the RO[k] can be produced under the control of test_in[k]. As shown in FIG. 3, every signal transition of the test_in[k], either low-to-high, or high-to-low, can cause the opposite transition of the osc_out[k]. The osc_out[k] can remain unchanged until the test_in[k] is changed. Thus, due to controllability embedded in the ROTS as shown in FIG. 3, the output of RO can be paused and reliably measured after each signal transition of the test_in[k].

In one embodiment, the test access port also provides a control signal to configure the RO to be paused or to be free running during the functional test. The output of free running RO can be observed at the osc_xout through the XOR network. The osc_xout can be an ideal location of observation because it can coincide with the time at which the collective ring oscillators' outputs are sampled during functional operation. In one embodiment, the osc_xout is observed at the tester. In another embodiment, the osc_xout is observed is monitored by an on-chip test circuitry which will be discussed is further detail below.

Figure 4:
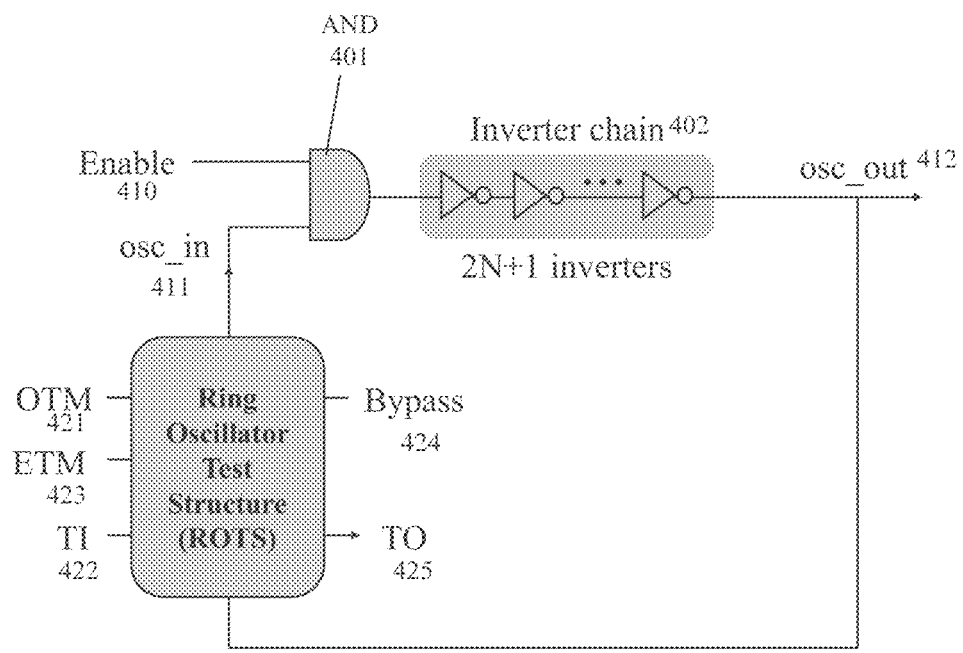
FIG. 4 illustrates one embodiment of a ring oscillator test structure (ROTS).

In one embodiment, the transformation of ring oscillator is achieved by insertion of the ring oscillator test structure (ROTS) as shown in FIG. 4. The ROTS can allow the uncontrollable combinational feedback of the RO to be controlled such that oscillation of the RO can be produced under the control of the test access port.

Referring to FIG. 4, the ROTS is placed in the feedback path of the RO. In one embodiment, enable signal 410 is incorporated into the RO and is assumed to be a global signal. The functional feedback path from osc_out 412 to osc_in 411 can be maintained in the ROTS. Osc_in 411 is combined with Enable signal 410 using AND gate 401. The output of AND gate 401 is connected to osc_out 412 through the inverter chain 402. When Enable signal 410 equals 1, osc_out 412 equals approximately osc_in 411 and hence, oscillation can be produced from the RO.

The ROTS can incorporate two test mode inputs denoted as (OTM 421, ETM 423), ring oscillator test mode and external input controlled test mode, respectively. In addition to the input test access port referred to herein as TI (test input) 421, in one embodiment, an output test access port TO (test output) 425 is added to observe the test response. Bypass signal 424 allows the RO to be paused or bypassed during the functional test.

In one embodiment, a serial chain of ROs is constructed by connecting the TO of one RO to TI 422 of next in the chain. The serial chain of RO can provide a supplemental test access for the RO test.

One embodiment of the test modes are summarized in the test mode decoding table below. In one embodiment, the RO are free-running at its functional speed in all test modes except the external input controlled test mode, or the (OTM 421, ETM 423)=11. In the external input controlled test mode, the output of the RO can be a function of or under the control of TI 422. The test requirement in this mode can be that oscillation of the RO must be produced through the functional feedback path. In one embodiment, the structural test of the TRNG is implemented in the external input controlled test mode. In functional mode, or the (OTM 421, ETM 423)=00, the test structure is quiescent and has no effect on function of the RO.

| OTM | ETM | Test mode description |
| --- | --- | --- |
| 0 | 0 | Functional mode |
| 0 | 1 | Auxiliary (functional) test mode |
| 1 | 0 | Functional test mode |
| 1 | 1 | Input controlled test mode |

In one embodiment, functional test of the RO is initiated when OTM 421⊕ETM 423 equals 1, where the symbol ⊕ denotes a logical XOR operation. In one embodiment, the functional test is performed via the XOR network in the functional test mode or via the serial chain of ROs in the auxiliary test mode.

Test constraint of the RO test in the functional test mode may be different from that in the auxiliary test mode. The RO test in the functional test mode, for example, may limit the number of concurrently oscillating ROs to small or possibly to one, in order to avoid interference from other ROs. The same test constraint, however, may not be applicable to the RO test in the auxiliary test mode. In this test mode, all or any number of ROs can be free running. In one embodiment, the auxiliary test mode is utilized for the test condition in which the test response cannot be measured reliably via the functional path or the XOR network.

Figure 5:
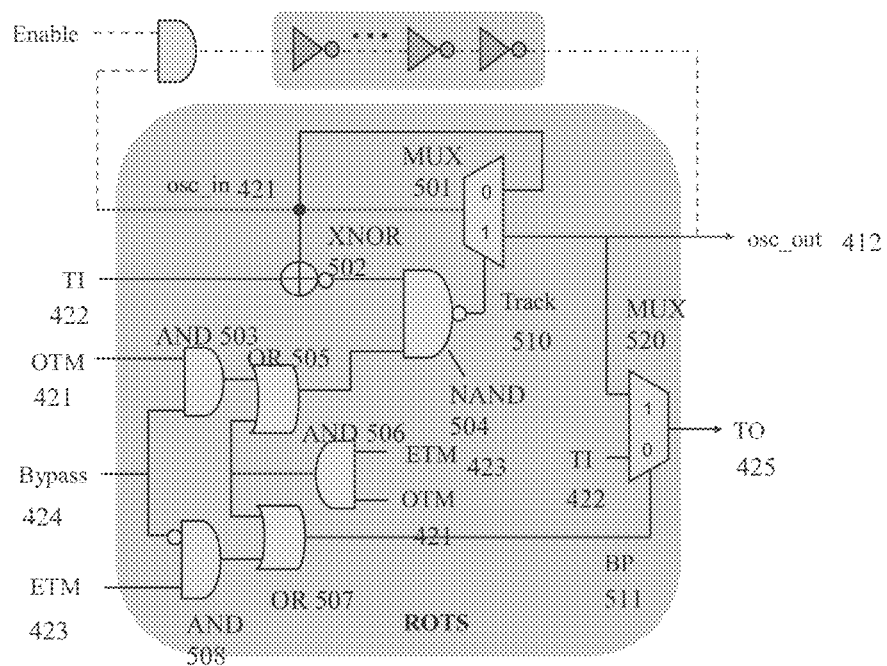
FIG. 5 illustrates one embodiment of a ring oscillator test structure.

FIG. 5 illustrates one embodiment of an internal structure of a ROTS is shown. The RO equipped with the ROTS is referred to herein as a testable ring oscillator (TRO). Referring to FIG. 5, the test mode signals (OTM 421, ETM 423) can activate and deactivate the test structure. Unless the (OTM 421, ETM 423) equals 00, the RO is under the control of ROTS.

The input test access port is implemented by the multiplexor (mux) 501 inserted between osc_out 412 and osc_in 411. The functional feedback path can conditionally be established by mux 501 depending on the signal state of Track signal 510. If Track 510 equals 1, for example, the functional feedback path from osc_out 412 to osc_in 411 can be established by mux 501. Otherwise, the latched output from mux 501 can be formed to isolate osc_in 411 from osc_out 412. Mux 501 can provide the input to osc_in 411 and blocks osc_out 412. Mux 501 can be initialized asynchronously into the same logical state as TI 422 after three logic gate delay of the gates which produce Track 510, from mux 501, XNOR 502 and NAND 504.

Track 510 can achieve a safe transition between the functional feedback path and the latched output by tracking the state of RO. In the functional mode, Track 510 equals 1 regardless of other inputs. In the external input controlled test mode, Track 510 can be determined by Track 510 equals osc_in 411⊕TI 422. If TI 422 can be kept at constant, the RO can be paused at the state which osc_out 412 equals ~TI 422. In the auxiliary test mode, or the (OTM 421, ETM 423) equals 01, Track 510 equals 1 and the RO can be free-running regardless of other inputs. Bypass 424 determines whether to bypass the RO or to test via the TO. In the functional test mode, or the (OTM 421, ETM 423) equals 10, Track 510 can be determined by Bypass 424, if TI 422 can be kept at constant. If Bypass 424 equals 0, for example, Track 510 equals 1 regardless of TI 422 and the RO can be oscillated or free running. Otherwise, the RO can be paused at the state which osc_out 412 equals ~TI 422.

In one embodiment, a bypass function is implemented by mux 501 that provides the TO in FIG. 5. If ETM 423 equals 0, the RO is bypassed or TO 425 equals TI 422, regardless of Bypass 424. In the auxiliary test mode, Bypass 424 can determine the output of RO to be observed at TO 425 or bypassed. If Bypass 424 equals 0, for example, TO 425 equals osc_out 412 and otherwise, TO 425 equals TI 422. In one embodiment, no RO can be bypassed in the external input controlled test mode. The bypass function can provide a power gating at the TO in the functional mode. That is, no oscillation can be produced at the TO during the functional operation.

The bypass feature can be useful in both characterization and silicon debug. In one embodiment, in characterization, any ring oscillator can be characterized in isolation by pausing or bypassing all other ring oscillators. Similarly, any suspected ring oscillator can be isolated and further be diagnosed.

Figure 6:
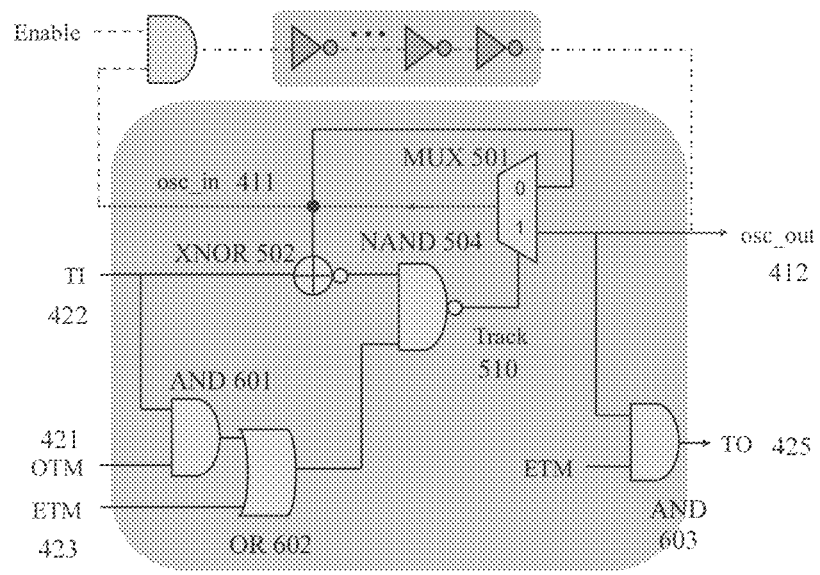
FIG. 6 illustrates an example of a simplified ring oscillator test structure.

If the auxiliary test mode were unnecessary, the ROTS can be simplified as shown in FIG. 6. The bypass multiplexor can be removed and Bypass 424 can be replaced with TI 422. The unused test mode (OTM 421, ETM 423) equals 01 can be assigned to the external input controlled test mode so that it can be forced when the ETM 423 equals 1. A low-to-high transition of ETM 423, or ETM↑, can function as a pause signal. TI 422, which can provide an input to the TRNG in structural test, can be used to configure the RO under test in functional test.

Figure 7:
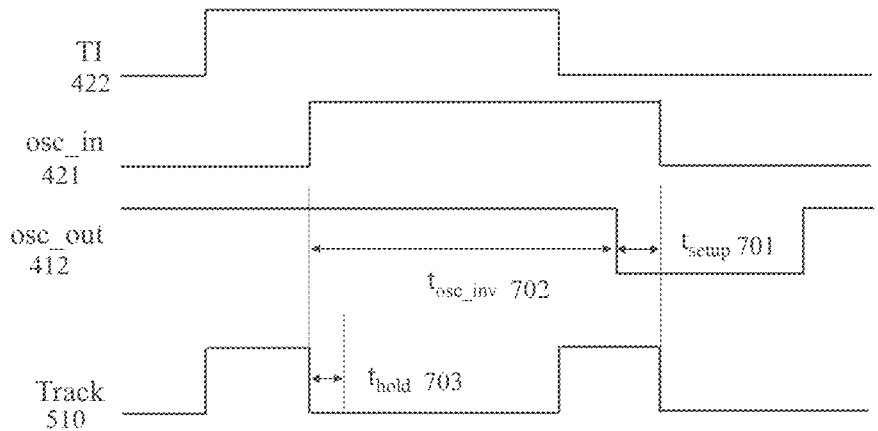
FIG. 7 illustrates setup and hold times of one embodiment of a ROTS.

Timing constraints of the latch formed during Track 510 equals 0 is presented in FIG. 7. Referring to FIG. 7, setup time 701 and hold time 703 can specify durations of what osc_out 412 should be stable. Setup and hold timing constraints along with delay of the inverter chain 702 can also specify the timing constraint of the TI including the maximum speed at which the TI can change during the test.

Figure 8:
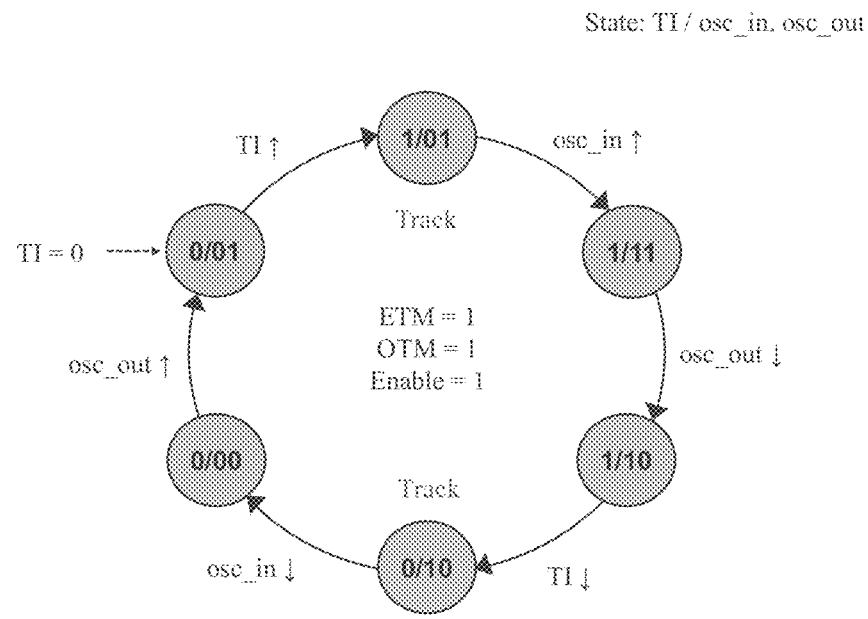
FIG. 8 illustrates one embodiment of an asynchronous FSM describing test sequence.

FIG. 8 illustrates the behavior of one embodiment of the TRO in the external input controlled test mode can be described by an asynchronous finite state machine (AFSM). Referring to FIG. 8, the state can be enumerated with the signal states of TI 422, osc_in 411, and osc_out 412. The backslash symbol is used to separate the external input from the functional feedback signals in the RO. For example, the state 0/01 can denote the signal states of TI 422 equals 0, osc_in 411 equals 0 and osc_out 412 equals 1.

Before the test is initiated, the test structure can be initialized to TI/TI(~TI) state by keeping TI 422 constant for longer than three gate delays mentioned earlier. The example shown above, TI 422 equals 0 and the initial state can be set to the 0/01. The RTOS can be waiting for a low-to-high transition of TI 422. In this state, Track 510 equals 0 because both the osc_in 411 and TI 422 are in the same signal state. The functional feedback loop can be deselected by Track 510 and osc_in 411 can be isolated from osc_out 412 by the latch. Osc_out 412 is in complementary signal state of osc_in 411 due to the inverter chain. When TI 422 equals 1, the state can be changed to the 1/01 state. The complementary signal states of TI 422 and osc_in 411 can cause a low-to-high transition of Track 510. When Track 510 equals 1, the functional feedback path is established and osc_in 411 is updated with osc_out 412, resulting in the 111 state. Similarly, the functional feedback path can be deselected while osc_out 412 can be updated with osc_in 411 through the inverter chain, resulting in the 110 state. This process can be repeated for the opposite transition of TI 422.

Figure 9:
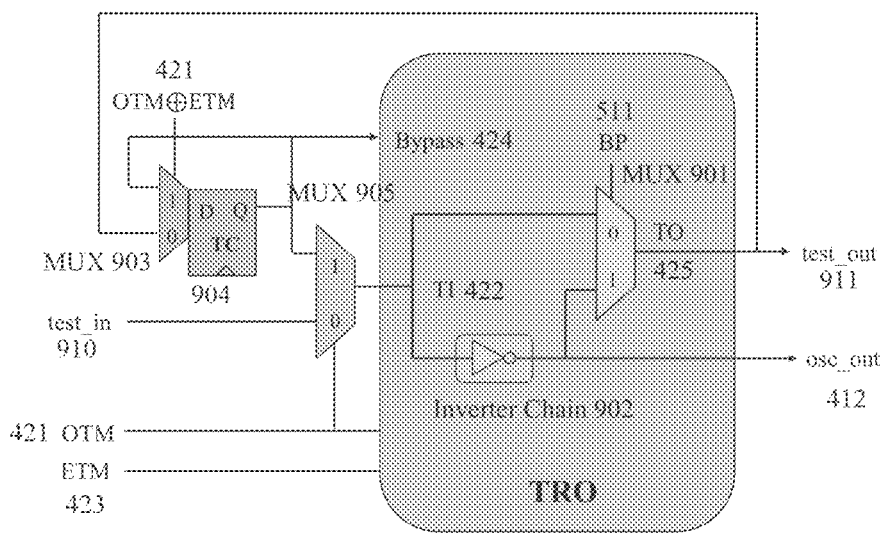
FIG. 9 illustrates one embodiment of an IO Test interface for one embodiment of a ROTS.

In one embodiment, the test interface is incorporated into the testable ring oscillator (TRO) in order to implement required test functions. A different interface can be provided for different test applications. One example of test interface is given in FIG. 9. In one embodiment, bypass 424 is provided from TC register 904. When OTM 421 equals 1, TI 422 can also be provided from TC register 904 and hence TI 422 and Bypass 424 can be held at the same signal state. In the functional test mode, Bypass 424 and TI 422 can configure the RO for oscillation and the signal state of osc_out 412 when the RO is paused, respectively. In one embodiment, in the external input controlled test mode, the output of TC register 904 is used to provide an input test stimulus to the TRNG and Bypass 424 is unused. The primary input, or test_in 910, can be connected to TI 422 in the auxiliary test mode and bypassed to test_out 911, if Bypass 424 equals 1.

Figure 10:
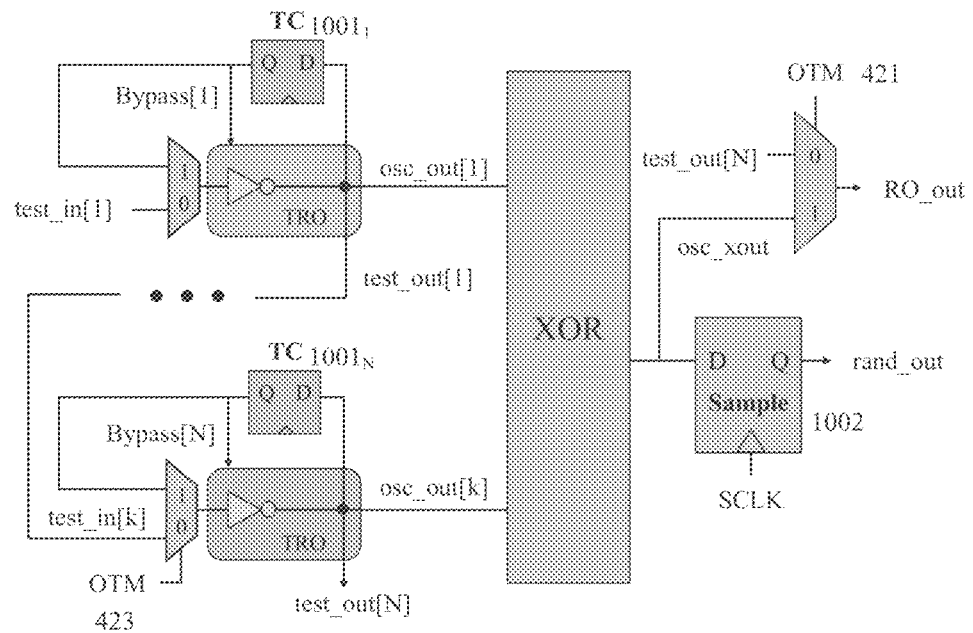
FIG. 10 illustrates one embodiment of a test environment of a TRNG.

FIG. 10 illustrates one embodiment of a test interface incorporated into the TRNG. Referring to FIG. 10, in the external input controlled test mode, the test input provided by the TC registers 1001 can be propagated to the osc_xout through the osc_out. In one embodiment, the test responses at osc_out 412 and the osc_xout are captured into the same TC register 1001 and the Sample register 1002, respectively. For functional test, in one embodiment, any RO can be configured to be free running and its oscillating output is propagated through either the XOR network or the serial chain of ROs. The selection of the test output at the RO_out is determined by OTM 421. If OTM 421 equals 1, then the test response can be observed through the osc_xout and otherwise, the test_out [N]. Furthermore, the output test path can be reconfigured dynamically without reprogramming the TC register 1001 by simply switching OTM 421 via the external input controlled test mode. That is, ETM 423 equals 1 prior to OTM 421 being changed. Providing an alternate way to observe oscillation of the same RO can enhance diagnostic resolution. The test responses from the different test paths can be compared for further analysis.

One embodiment of a process for carrying out the structural test of TRNG using the test interface is discussed below.

A Structural Test of a TRNG

Figure 11:
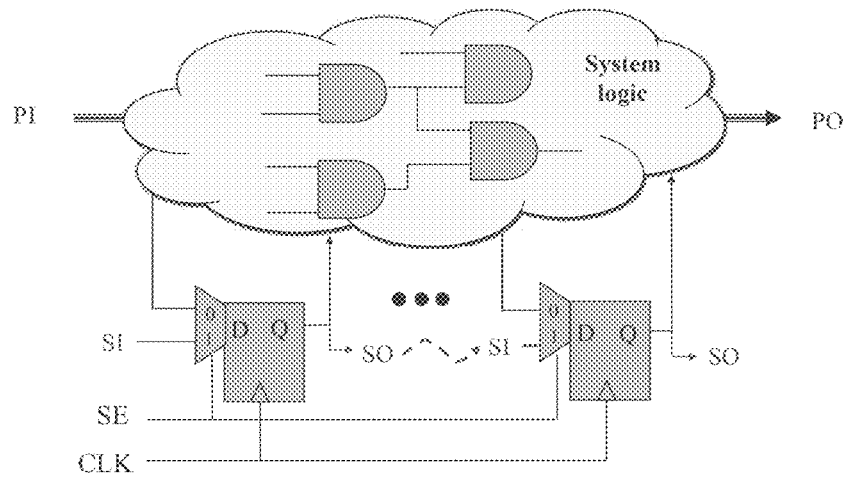
FIG. 11 illustrates an example of a scan chain.

The structural test is a low cost test commonly applied to digital random logic. In the structural test, the internal registers (or flip-flops) can be connected serially to form a test access called a scan chain as shown in FIG. 11. If the SE (or scan enable) equals 1, the scan chain can be used to initialize the internal registers for the test and to observe the test response after they are captured when the SE equals 0. Since the internal registers can be initialized to any state by loading the scan chain, the structural test can transform the problem of testing sequential circuits into that of combinational which can be more tractable.

The commonly used structural tests can include the stuck-at and delay tests. The stuck-at test can target static faults such as faulty logic 1 and 0. The delay test can target dynamic or timing faults such as slow-to-rise and slow-to-fall. Since the transition delay is required to be measured in the delay test, an input transition can be launched prior to an output transition to be captured so that the expected transition delay can be compared with the duration of launch and capture based on the captured test response. The structural tests, however, cannot directly be applied to the testing of circuits involving ROs due to their uncontrollable asynchronous feedback.

Figure 12A:
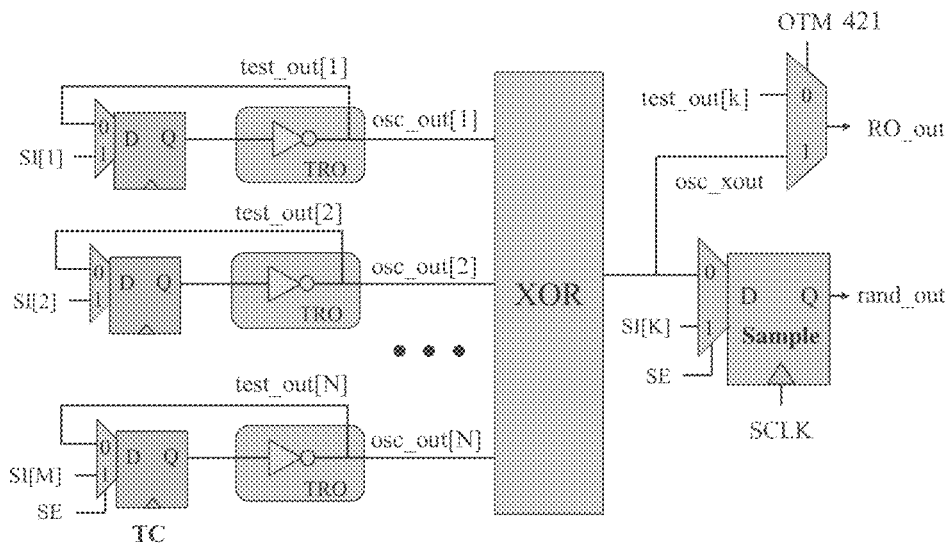
FIG. 12A illustrates one embodiment of a structural test of a TRNG.

In one embodiment, the ROTS allows control of the asynchronous feedback from the external input. The structural test can be performed in the external input controlled test mode. In one embodiment, the TRNG is assumed to be tested by the stuck-at test and the constituting ROs by both the stuck-at and delay tests. FIG. 12A illustrates one embodiment of the structural test environment. The TC and Sample registers are assumed to be accessed via the scan chains. The oscillation function of the RO can be targeted by the stuck-at test and a period of oscillation by the delay test. Note that testing of a period of oscillation can include that of the oscillation function. Depending on test criteria and test cost constraints, the oscillation function of RO can only be targeted by the stuck-at test at manufacturing test. If, however, the both tests were attempted at manufacturing, the stuck-at test can be applied prior to the delay test for early detection of the oscillation failure which can be easier and cheaper to detect than the period of oscillation failure.

In the structural test mode or the external input controlled test mode, the asynchronous feedback can be enabled for a short period time if Track 510 equals 1. Otherwise, the feedback path can be broken by the latch and cannot be reestablished until TI 422 is changed. In this steady-state, osc_out 412 (or test_out) equals ~TC.Q, where the TC.Q denotes the output of the TC register.

Figure 12B:
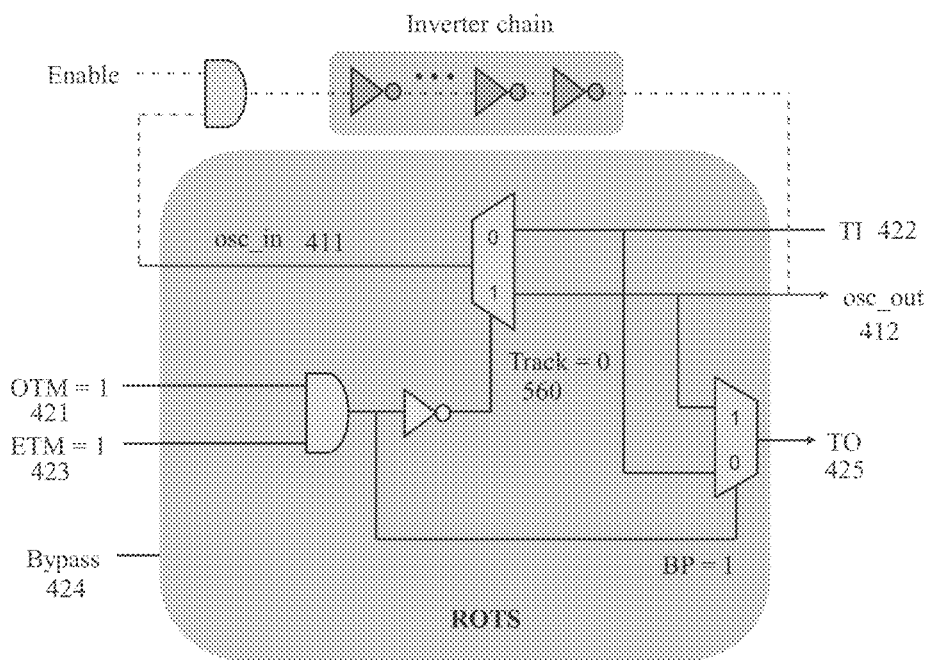
FIG. 12B illustrates the ROTS at steady-state when (OTM, ETM) equals 11.

FIG. 12B illustrates the ROTS in the steady-state. Note that no functional feedback path is present in the ROTS. TI 422 provides an input to the inverter chain whose output can be observed at the osc_out 412 and TO 425. The steady-state behavior allows the TRO to be viewed as an inverter without asynchronous feedback. In one embodiment, the TC register provides the input to TI 422 in the TRO and captures the test response at TO 425. In one embodiment, the input of the XOR network can also be provided from the TC register through the osc_out 412 and the test result can be captured into the Sample register.

The ROTS at steady-state can be employed in automatic test pattern generation (ATPG) which can be carried out by the commercial ATPG tools. In one embodiment, generation of the structure test pattern follows the structural test procedure referred to herein as "scan test protocol" provided below. For discussion, the structural test procedure is annotated with how the ROs can be tested.

An Example Structural Test Procedure
1. OTM=1; ETM=1; // Structural test mode
2. SE=1; // Enable scan chains to deliver test data
3. Scan load/unload; // Initialize/observe sample & test registers
4. SE=0; // Disable scan chains to capture test response
5. Force primary inputs;
6. Measure primary outputs;
7. Launch/Capture; // Delay test of RO (Capture only for stuck-at)
8. go to step 2 until finished;

The test mode (OTM, ETM)=11 is set for the structural test in step 1. When the SE=1, the internal registers forms a set of scan chains (or shift registers) in step 2. When the scan chains are enabled, the system logic is ignored. In step 3, the internal registers including the Sample and TC registers are initialized by shifting in the test stimulus at the input of scan chains while observing the shifted out test response at the output of scan chains. After the internal registers are initialized, the SE=0 and the TRNG logic, including the ring oscillators, is enabled in step 4. After forcing primary inputs in step 5 and measuring primary outputs in step 6, the faults in the combinational 10 logic are detected. For the stuck-at test of TRNG, the test response at the test_out and osc_out 412 are captured into the TC register and the Sample, respectively in step 7. In one embodiment, the test response captured in the TC register is expected to be a complementary of the input delivered in the same TC. For the delay test of RO, the input transition can be launched by the test_out, which is complementary of the input delivered in the TC register. The launch is followed by the capture after a half period of RO under test. The expected test response after the launch and capture is the same as the input delivered in the TC register. The scan chains are enabled by the SE equals 1 in step 2. In step 3, the captured test response is shifted out to the tester for a test decision while the new test input is shifted in. The test procedure is repeated until the test is completed.

Location of faulty ring oscillator can immediately be determined from the content of TC registers after test in step 7. The test result captured in the TC registers can indicate which ring oscillators are faulty. The fault location information can be brought out to the tester in step 3 for detailed analysis.

An Example Functional Test of an Individual Ring Oscillator

Figure 13:
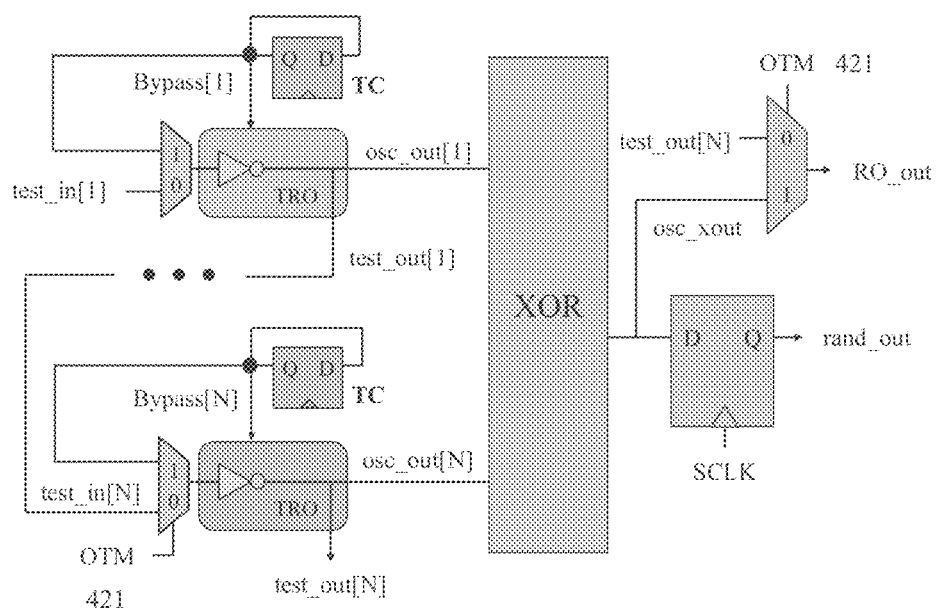
FIG. 13 illustrates an example of a RO functional test environment.

The test structure described herein and test interface can allow the functional test to be configured by the TC registers. The TC registers can be programmed via various industry standard serial interfaces such as, for example, IEEE STD Boundary Scan or I2C. FIG. 13 illustrates the functional test environment of RO. The testing of the RO is performed through the XOR network or the serial chain of ROs. Referring to FIG. 13, the selection of the output test path is made by OTM 421. In the functional test mode, the TC register delivers a control input to Bypass 424 and TI 422. Bypass 424 allows the RO[k] to oscillate, if Bypass 424 equals 0. Otherwise, the RO[k] can be paused at which osc_out 412 equals ~TI. In the functional test mode, any number of ROs may concurrently be oscillated. Their collective outputs are measured at the RO_out through the osc_xout. For the purpose of discussion, however, a single RO is assumed to be free running so that its output can be observed without interference from other ROs.

In one embodiment, the output of RO under test is also measured in the auxiliary test mode. In this test mode, all ROs are oscillated but bypassed except the RO under test. Since all ROs are simultaneously oscillating, a switching noise resulted from the nearby ROs can be incorporated into the functional test of the RO under test.

Figure 14:
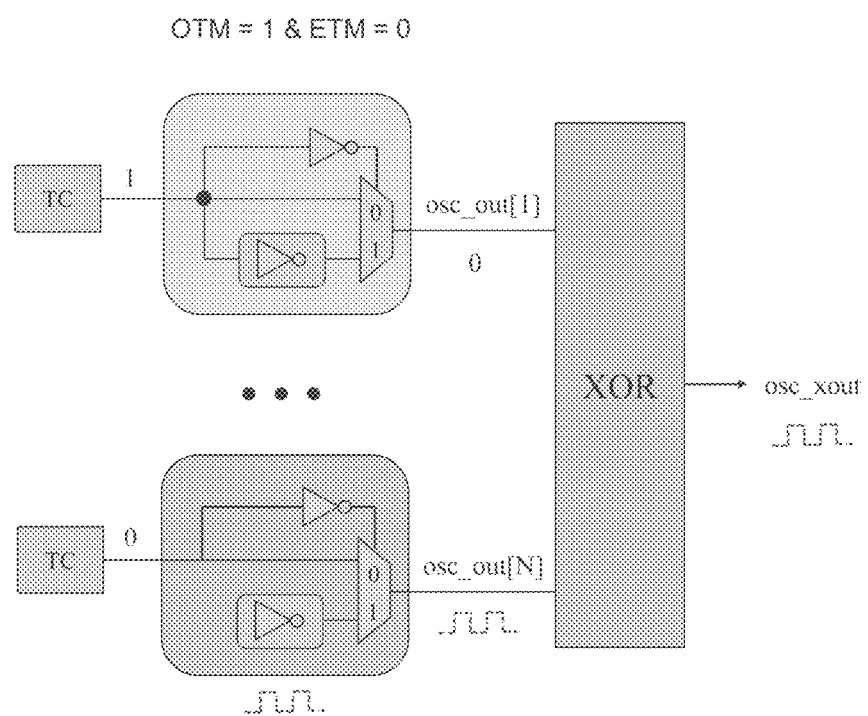
FIG. 14 illustrates a RO test in a functional test mode.

FIG. 14 illustrates a RO test in the functional test mode. Referring to FIG. 14, in this example, all the ring oscillators except the last one are paused as indicated by the content of TC. The external input of the last RO is removed to indicate the free running RO. The output of the paused RO can be set in such a way that has no effect at the osc_xout. When the RO is paused, for example, TI 422 equals 1 and hence, the osc_out 412 equals 0, which has no effect on the XOR logical operation in the XOR network. Thus, the osc_xout can be determined by the output of the RO under test. In one embodiment, the output of the RO is analyzed at the tester or measured at the on-chip test circuitry.

In some test applications, correlation of the oscillating outputs of multiple ROs may need to be investigated. In the true random number generation, it can be important that a jitter of one RO is not to be locked to that of others. In this situation, two or more ROs can be programmed to oscillate and their correlation analyzed at the osc_xout.

Figure 15A:
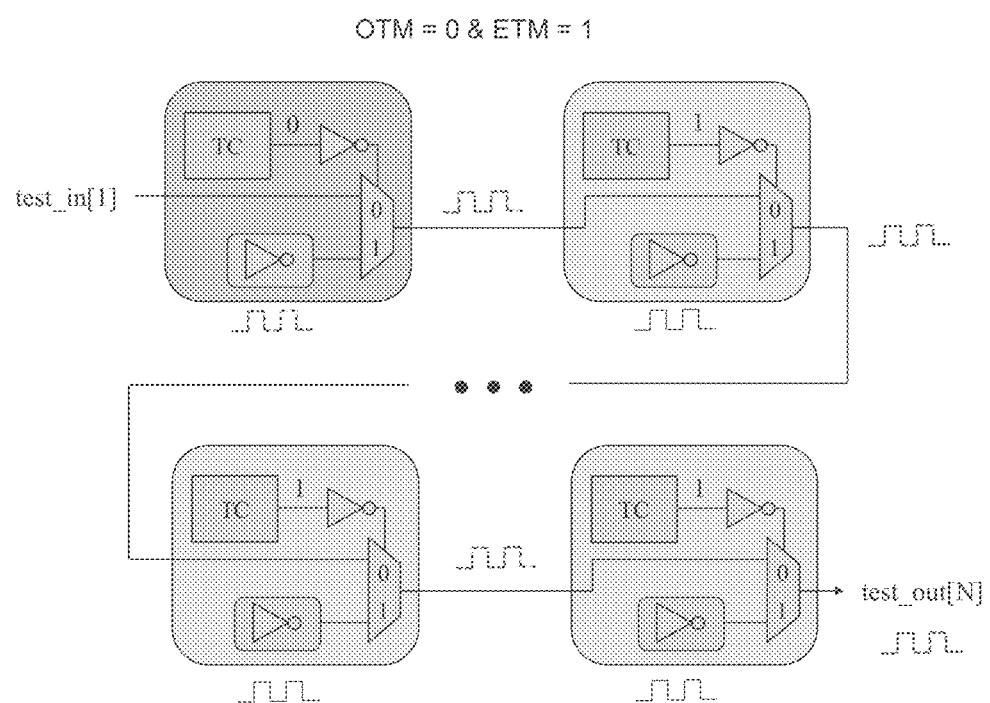
FIG. 15A illustrates an example of a RO test in auxiliary test mode.

FIG. 15A illustrates an example RO test in the auxiliary test mode. Referring to FIG. 15A, all ROs can be free running, and Bypass 424 selects the RO under test and bypasses the rest. In this example, the first RO is selected for test and all other ROs are bypassed as indicated by the content of the TC registers. If the multiple ROs were selected to be observed, the serial chain of ROs formed through the test access ports allows oscillation of the RO closest to the output of the serial chain to be observed at the test_out[N].

In one embodiment, the bypass path is tested when all ROs are bypassed. Any transition of test_in[1] causes the same transition at the test_out[N].

Figure 15B:
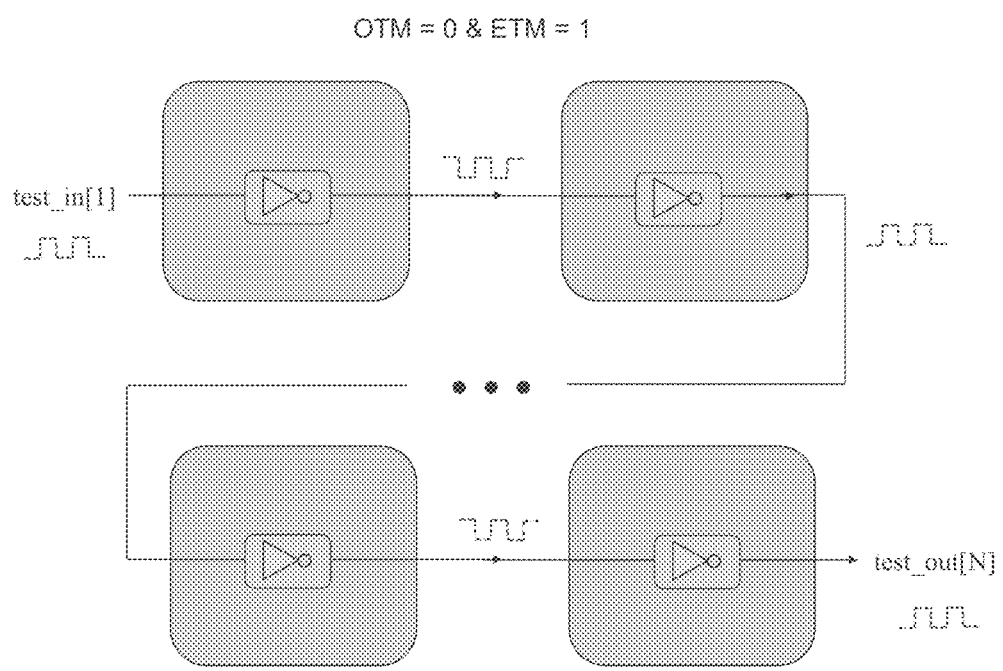
FIG. 15B illustrates the RO test with a simplified ROTS.

FIG. 15B illustrates an RO test utilizing the auxiliary test mode with the simplified ROTS discussed in FIG. 6. Referring to FIG. 15B, all the inverter chains in the ROs are connected in serial fashion. Any transition of test_in[1] causes the same or opposite transition at the test_out[N] depending on number of ROs in the RO chain. Oscillation is produced at the test_out [N] under the control of the test_in[1] exactly the same way as in the externally controlled test mode.

Figure 16:
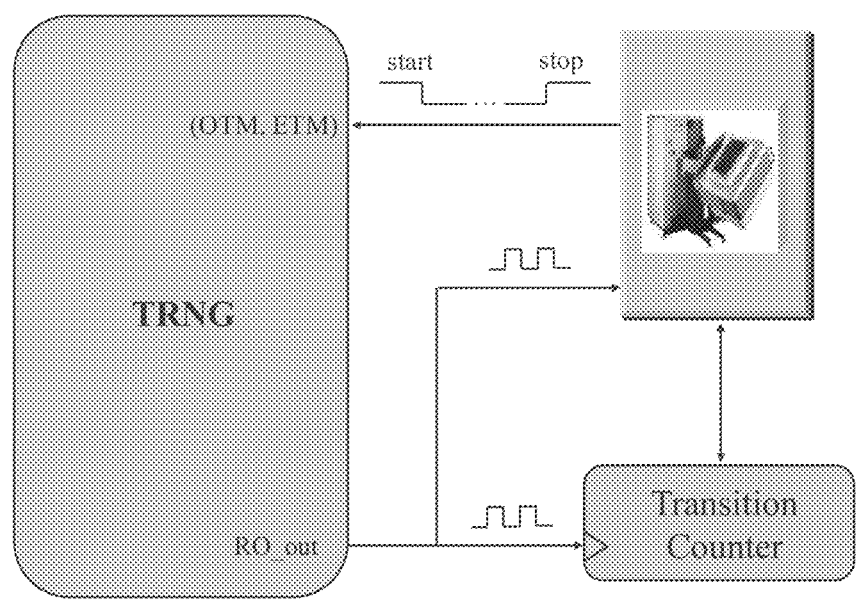
FIG. 16 illustrates an example of an environment of a functional test.

In one embodiment, the output of the RO under test is measured through the RO_out at the tester or captured into the on-chip test circuitry shown in FIG. 16. The number of oscillations can be measured between the start and stop signals provided from the tester. The start signal can be provided from a transition from the external input controlled test mode to any of the functional test modes and can cause the RO under test to oscillate. The number of transitions, either high-to-low or low-to-high, can be recorded at the transition counter until the ring oscillator is stopped. The ring oscillator can be stopped by changing the test mode back to the external input controlled test mode, or the (OTM 421, ETM 423) equals 11. In the functional and auxiliary test modes, or the (OTM 421, ETM 423) equals 10 and 01, all RO can be paused by the ETM↑ and OTM↑, respectively. The external input controlled test mode can force the RO to be paused at the state which osc_out 412 equals ~TI, as discussed above. In some test applications in which a global enable signal is available, it can be used to provide the start signal or both the start and the stop signals for the ring oscillators.

The example functional test procedure is summarized below. The ring oscillators can be enabled for the entire test as in step 1. All the ring oscillators can be paused for initialization of the test in step 2. The transition counter is checked for test decision before initialization in step 3. The TC registers can be programmed to select the ring oscillator under test in step 4. The functional test can be initiated by change of test mode from the external input controlled test mode to the desirable functional mode in step 5. The ring oscillator under test provides clock pulses to the transition counter which increment its content by one for every pulse received in step 6, until the ring oscillator is stopped in step 7. For the next ring oscillator under test, the procedure can be repeated from the step 2. The functional test procedure can be repeated for all remaining ROs.

An Example Functional Test Procedure
1. Enable=1; // Enable all ROs
2. OTM=1; ETM=1; // Pause all ROs
3. Check and initialize transition counter; // check test result
4. Program TC registers; // Select RO under test
5. Set test mode; // Enable RO under test to start test
    a. OTM=1; ETM=0; // Functional test mode
    b. OTM=0; ETM=1; // Auxiliary test mode
6. Count number of output transitions at RO_out;
7. If (functional test mode) {ETM=1;} // Stop counting Else {OTM=1;} // Pause all ROs (OTM, ETM)=11
8. Go to step 2 until finish In one embodiment, the test limits for the pass-fail decision are determined from the design specification or obtained empirically. The design specification can provide an expected number of oscillations. The expected number of oscillations is calculated from the test time interval marked by the start and stop in FIG. 16 divided by the expected or specified period of the RO. The allowed lower and upper bounds of variations are used to specify a minimum and maximum number of oscillations in a given test time interval, respectively. The test limits are also obtained empirically by characterization of the ROs from a number of devices sampled in different process corners. Once the test limits are determined, the content of transition counter after test is compared with the test limit for a test decision.

Thus, embodiments of the scheme described herein provide a cost efficient test solution to the problem of testing the true random number generator (TRNG) involving a large number of ring oscillators employed in cryptography for secret key generation. Embodiments of the scheme allow the structural test of the TRNG and the functional test of ring oscillators. Embodiments of the scheme also scale well with the increased problem size so that the test cost can remain nearly constant even if the number of ring oscillators is increased. The techniques described herein, if applied to IP and end products, can reduce test cost, improve test quality and optimize engineering efficiency in test development.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A random number generator comprising:
    two or more ring oscillator structures, each of the ring oscillator structures having an output connected through a network of logic gates and storage cells for random number generation, each of the ring oscillator structures configured to operate in a functional mode and a test mode, each of the ring oscillator structures comprising:
        a ring oscillator configured to generate random numbers, the ring oscillator comprising a feedback path between an output of an inverter chain of the ring oscillator and an input of the inverter chain of the ring oscillator, and
        a test structure to reconfigure the ring oscillator structure into a testable structure for testing the ring oscillator structure and the network of logic gates and storage cells in the test mode by changing the feedback path of the ring oscillator, the testable structure comprising a test access port configured to provide access for performing a structural test and a functional test, the structural test performed to identify a fault location in the random number generator, the functional test performed to check functionality of the random number generator.

2. The random number generator of claim 1, wherein the test structure further comprises a multiplexer coupled to the output of the inverter chain of the ring oscillator and to the input of the inverter chain of the ring oscillator to selectively enable the feedback path of the ring oscillator based on a signal.

3. The random number generator of claim 2, wherein the signal is an output of a first gate responding to first and second inputs, the first input being the output of an XNOR gate that applies XNOR logic to a test input and an output of the multiplexer and the second input being based on or more or more test mode signals.

4. The random number generator of claim 1, wherein each of the two or more ring oscillator structures has a test interface for performing test functions, the test interface having a multiplexer to provide, based on a select input, either a test input or a value based on a feedback of a test output, the select input based on one or more test mode signals.

5. The random number generator of claim 1, further comprising:
    an XOR network having a plurality of inputs coupled to outputs of the two or more ring oscillator structures and having an output to provide a test response;
    a plurality of registers, each register providing a test input to the XOR network and to receive an output of two of the one or more ring oscillator structures; and
    a plurality of multiplexers having a pair of inputs and an output, the output of each multiplexer in the plurality of multiplexers coupled to an input of a ring oscillator of a distinct one of the two or more ring oscillator structures, the inputs being coupled to a test input and an output of one of the plurality of registers.

6. The random number generator of claim 5, wherein the plurality of registers configured to capture test results and indicate one or more faulty ring oscillator structures.

7. The random number generator of claim 5, wherein the plurality of multiplexers are controlled by a test mode signal, and wherein a change in the test mode signal causes a dynamic reconfiguration of an output test path associated with the ring oscillator structures without reprogramming of the plurality of registers.

8. The random number generator of claim 1, wherein the ring oscillator comprises an odd number of inverters connected back-to-back and configured to produce an oscillatory output.

9. The random number generator of claim 1, wherein the test structure is coupled to provide either an observability chain input or a test input to the ring oscillator structure and to receive the oscillatory output as a feedback from the ring oscillator.

10. The random number generator of claim 1, wherein the structural test includes a structural stuck-at test of the ring oscillator.

11. The random number generator of claim 1 wherein the ring oscillator structures comprise a group of ring oscillator structures connected in a serial chain, wherein a test output of a last of the ring oscillator test structures in the serial chain is fed back for use with the test input to a first ring oscillator structure in the chain.

12. The random number generator of claim 1, further comprising a transition counter configured to measure transitions of a ring oscillator structure at a ring oscillator output until a test mode is changed.

13. The random number generator of claim 12, wherein the test structure starts a functional test in response to a change of test mode from an external input controlled test mode.

14. The random number generator of claim 1, wherein the test structure outputs in steady-state to allow at least one of the ring oscillator structures to appear as an inverter without asynchronous feedback.

15. The random number generator of claim 1, wherein the two or more ring oscillator structures using the test structures collectively identify an odd number of path struck-at faults based on complimentary polarity in bypass and functional paths of the two or more ring oscillator structures.

16. A random number generator comprising:
one or more ring oscillator structures, each of the one or more ring oscillator structure having an output connected through a network of logic gates and storage cells for random number generation, each of the one or more ring oscillator structures comprising:
a ring oscillator for generating random numbers, and
a test structure to reconfigure a ring oscillator structure into a testable structure for testing the ring oscillator structure and the network of logic gates and storage cells
an XOR network having a plurality of inputs coupled to outputs of the one or more ring oscillator structures and having an output to provide a test response;
a plurality of registers, each of the registers coupled to provide a test input to the XOR network and to receive an output of one of the one or more ring oscillator structures; and
a plurality of multiplexers having a pair of inputs and an output, the output of each of the multiplexers coupled to an input of a ring oscillator structure, the inputs coupled to a test input and an output of one of the plurality of registers.

17. The random number generator of claim 16, wherein the test structure comprises a test access port.

18. The random number generator of claim 17, wherein the test access port provides access for structural and functional tests and identifying of a fault location in the random number generator.

* * * * *